United States Patent
Lim et al.

(10) Patent No.: US 10,304,542 B2
(45) Date of Patent: May 28, 2019

(54) MEMORY DEVICE AND METHOD OF OPERATING THE SAME TO PREVENT OCCURRENCE OF READ FAIL BY ADJUSTING BIT LINE VOLTAGE

(71) Applicant: SK hynix Inc., Gyeonggi-do (KR)

(72) Inventors: Sung Yong Lim, Gyeonggi-do (KR); Seung Hwan Baek, Gyeonggi-do (KR); Yeon Ji Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/613,649

(22) Filed: Jun. 5, 2017

(65) Prior Publication Data

US 2018/0061501 A1 Mar. 1, 2018

(30) Foreign Application Priority Data

Aug. 29, 2016 (KR) .................... 10-2016-0109984

(51) Int. Cl.
  *G11C 13/00* (2006.01)
  *G11C 16/16* (2006.01)
  *G11C 16/04* (2006.01)

(52) U.S. Cl.
  CPC .......... *G11C 16/16* (2013.01); *G11C 16/0483* (2013.01)

(58) Field of Classification Search
  CPC .... G11C 16/344; G11C 16/16; G11C 16/0483
  See application file for complete search history.

(56) References Cited

U.S. PATENT DOCUMENTS

| RE44,978 E * | 7/2014 | Baik ...................... G11C 16/34 365/185.22 |
| 9,293,208 B2 * | 3/2016 | Yoo ........................ G11C 16/24 |
| 9,984,760 B1 * | 5/2018 | Zhang ................ G11C 16/3431 |
| 2008/0219053 A1 * | 9/2008 | Kim .................... G11C 16/0483 365/185.11 |
| 2014/0003147 A1 * | 1/2014 | Dutta .................. G11C 11/5635 365/185.11 |
| 2014/0136765 A1 * | 5/2014 | Oh ...................... G11C 16/0483 711/103 |
| 2015/0003162 A1 * | 1/2015 | Mui .................... G11C 11/5635 365/185.17 |
| 2016/0267004 A1 * | 9/2016 | Perlstein ............. G06F 12/0246 |

(Continued)

FOREIGN PATENT DOCUMENTS

| KR | 1020150014456 | 2/2015 |
| KR | 1020150060144 | 6/2015 |

Primary Examiner — Mushfique Siddique
(74) Attorney, Agent, or Firm — IP & T Group LLP

(57) ABSTRACT

A memory device includes a memory block including a plurality of stacked sub-memory blocks, peripheral circuits configured to perform program, read and erase operations on the memory block or on a block selected from among the sub-memory blocks, and a control logic configured to control the peripheral circuits so that, during a read operation on the memory block, if a block on which a partial erase operation has been performed is not present among the sub-memory blocks, voltages to be used for the read operation are set and so that, if a block on which the partial erase operation has been performed is present among the sub-memory blocks, the voltages to be used for the read operation are varied depending on a position of a sub-memory block that is a target of the read operation.

16 Claims, 15 Drawing Sheets

(56) References Cited

U.S. PATENT DOCUMENTS

2017/0084340 A1* 3/2017 Lee ................... G11C 16/28
2017/0236591 A1* 8/2017 Shimura ............. G11C 16/26
                                                365/185.12

* cited by examiner

MEMORY DEVICE AND METHOD OF OPERATING THE SAME TO PREVENT OCCURRENCE OF READ FAIL BY ADJUSTING BIT LINE VOLTAGE

CROSS-REFERENCE TO RELATED APPLICATION

The present application claims priority under 35 U.S.C. § 119(a) to Korean patent application number 10-2016-0109984, filed on Aug. 29 2016, the entire disclosure of which is incorporated herein by reference in its entirety.

BACKGROUND

Field of Invention

Various embodiments of the present disclosure relate to a memory device and a method of operating the memory device and, more particularly, to a read operation of a memory device including a memory block on which a partial erase operation is performed.

Description of Related Art

Memory devices may be classified into a volatile memory device and a nonvolatile memory device.

The nonvolatile memory device has relatively low write and read speeds compared to the volatile memory device, but may maintain data stored therein even if the supply of power is interrupted. Therefore, nonvolatile memory devices are used widely in portable electronic devices for storing data that need to be maintained regardless of whether or not power is supplied to the memory device at all times. Examples of nonvolatile memory devices include a Read Only Memory (ROM), a Mask ROM (MROM), a Programmable ROM (PROM) an Erasable Programmable ROM (EPROM), an Electrically Erasable Programmable ROM (EEPROM), a flash memory, a Phase change Random Access Memory (PRAM), a Magnetic RAM (MRAM), a Resistive RAM (RRAM), a Ferroelectric RAM (FRAM), etc. depending on the scheme for storing data.

The flash memory device may be formed either in a two-dimensional (2D) structure in which cell strings are arranged horizontally on a semiconductor substrate or in a three-dimensional (3D) structure in which cell strings are arranged vertically on a semiconductor substrate. 3D memory devices are devised to overcome a limitation in the degree of integration of the 2D memory devices, and may include a plurality of memory cells stacked vertically on a semiconductor substrate. 3D memory devices are relatively new and substantial research and development efforts are spent in improving their performance characteristics.

SUMMARY

Various embodiments of the present disclosure are directed to a 3D memory device exhibiting improved reliability. The present disclosure is also directed to a method of operating the 3D memory device.

One embodiment of the present disclosure provides a memory device. The memory device may include a memory block including a plurality of sub-memory blocks; a peripheral circuit configured to perform at least one of program, read and erase operations on the memory block or on a block selected from among the sub-memory blocks; and a control logic configured to control the peripheral circuit so that, during a read operation on the memory block, if a partially erased sub-memory block on which a partial erase operation has been performed is not present among the sub-memory blocks, at least one voltage to be used for the read operation is set and so that, if the partially erased sub-memory block is present among the sub-memory blocks, the voltage is varied depending on a position of a target sub-memory block for the read operation.

The present disclosure provides a method for operating a memory device. The method may include setting a bit line voltage; determining whether a partially erased sub-memory block is present among sub-memory blocks included in a selected memory block; maintaining the bit line voltage if a partially erased sub-memory block is not present; maintaining the bit line voltage or setting a bit line voltage having a level lower than that of the bit line voltage depending on a position of a target sub-memory block for a read operation if the partially erased sub-memory block is present; and performing the read operation using one of the maintained bit line voltage and the set bit line voltage.

Further, the present disclosure provides a method for performing a read operation on at least one sub-memory block selected from among sub-memory blocks in a memory device. The method may include: setting a first bit line voltage; maintaining the first bit line voltage or re-setting an N-th bit line voltage that becomes lower than the first bit line voltage, depending on a number of at least one partially erased sub-memory block and a position of a target sub-memory block for a read operation if the partially erased sub-memory block is present among the sub-memory blocks; and performing the read operation on the selected sub-memory blocks using the first bit line voltage or the N-th bit line voltage.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
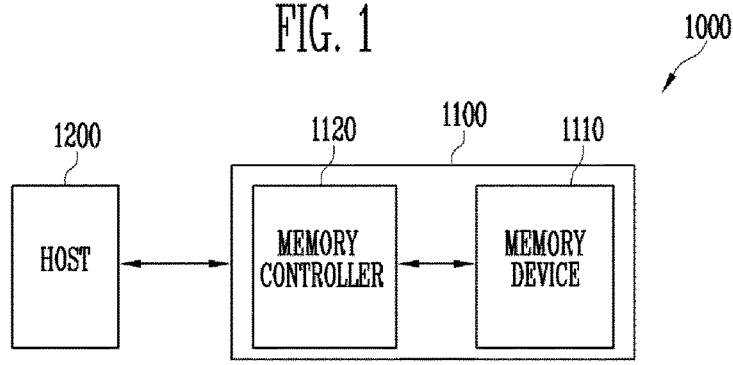
FIG. 1 is a diagram illustrating a data processing system including a memory system coupled to a host, according to an embodiment of the present disclosure.

Example embodiments will now be described more fully hereinafter with reference to the accompanying drawings; however, we note that the present invention may be embodied in different other forms and should not be construed as limited to the embodiments set forth herein. Rather, these embodiments are provided so that this disclosure will be thorough and complete, and will fully convey the present invention to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

It is also noted that the various embodiments are described herein with reference to simplified schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. Also, in the drawings, dimensions of various elements, layers and regions may be exaggerated for clarity.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

It will be further understood that when an element is referred to as being "connected to", or "coupled to" another element, it may be directly on, connected to, or coupled to the other element, or one or more intervening elements may be present In addition, it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" or "under" other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise, Hereinafter, the various embodiments of the present invention will be described in detail with reference to the attached drawings.

FIG. 1 is a diagram illustrating a data processing system 1000 including a memory system 1100 coupled to a host 1200, according to an embodiment of the present disclosure.

Referring to FIG. 1, the memory system 1100 may include a memory device 1110 for storing data and a memory controller 1120 capable of controlling the memory device 1110.

The host 1200 may communicate with the memory system 1100 using any suitable interface protocol, such as a Peripheral Component Interconnect-Express (PCI-E), an Advanced Technology Attachment (ATA), Serial ATA (SATA), a Parallel ATA (PATH), a Serial Attached SCSI (SAS a Universal Serial Bus (USB), a Multi-Media Card (MMC), an Enhanced Small Disk Interface (ESDI) and an Integrated Drive Electronics (IDE).

The memory controller 1120 may control at least one operation of the memory system 1100 including controlling a data exchange between the host 1200 and the memory device 1110. For example, the memory controller 1120 may control the memory device 1110 to perform at least one of a program, read and erase operation in response to a corresponding program, read, or erase request of the host 1200.

The memory device 1110 may be or include a Double Data Rate Synchronous Dynamic Random Access Memory (DDR SDRAM), Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM) or a flash memory. In the present embodiment, the Memory device 1110 implemented as a flash memory will be described by way of example.

Figure 2:
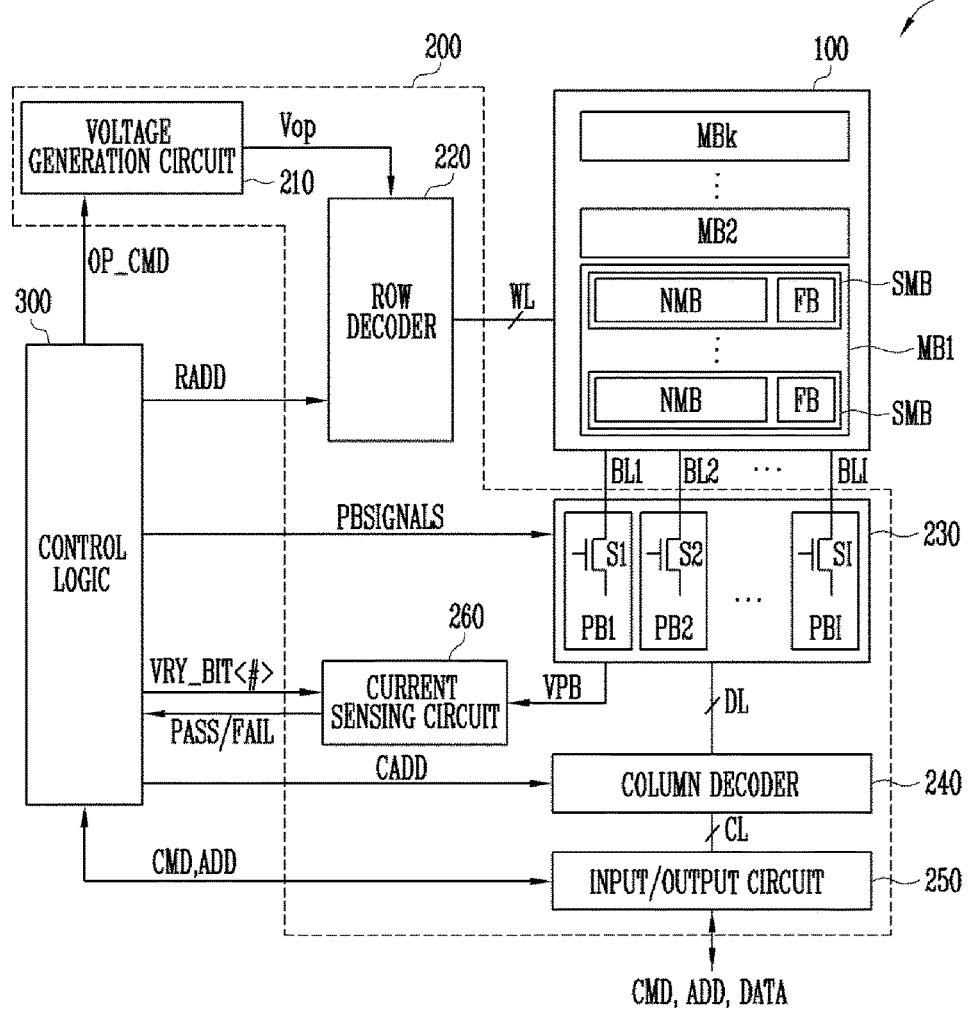
FIG. 2 is a diagram illustrating an exemplary configuration of a memory device employed in the memory system of FIG. 1.

FIG. 2 is a diagram illustrating the memory device 1110 of FIG. 1.

Referring to FIG. 2, the memory device 1110 may include a memory cell array 100 including a plurality of memory cells for storing data. The memory device 1110 may include a peripheral circuit 200 configured to perform at least one of a program operation for storing data in the memory cell array 100, a read operation for outputting the stored data, and an erase operation for erasing the stored data. The memory device 1110 as illustrated in the embodiment of FIG. 2, may include a control logic 300 for controlling the peripheral circuit 200 under the control of the memory controller 1120 (see FIG. 1).

The memory cell array 100 may include a plurality of memory blocks MB1 to MBk (where k is a positive integer). The memory blocks MB1 to MBk may be coupled to a plurality of word lines WL and a plurality of bit lines BL1 to BLl (where l is a positive integer). More specifically, each memory block may be coupled to a separate group of word lines among the plurality of word lines WL (not shown). Also, each of the bit lines BL1 to BLl may be coupled in common to all of the memory blocks MB1 to MBk (not shown). The memory blocks MB1 to MBk may be implemented in a 2D or 3D structure. When the memory blocks MB1 to MBk are implemented in the 3D structure, source select lines, drain select lines, and a source line, in addition to the word lines WL, may be coupled to each of the memory blocks MB1 to MBk and pipelines may be additionally coupled thereto depending on the structure of the memory blocks MB1 to MBk. Each of the memory blocks MB1 to MBk may have a plurality of sub-memory blocks SMB.

Further, each of the memory blocks MB1 to MBk may include a normal memory block NMB and a flag block FB, and each of the sub-memory blocks SMB may also include a normal memory block NMB and a flag block FB. Each normal memory block may include normal memory cells in which user data may be stored. Each flag block may include flag cells in which data related to the memory device may be stored. For example, a flag cell may store data indicating whether a partial erase operation has been performed on a memory block and data related to a sub-memory block on which the partial erase operation has been performed.

The peripheral circuit 200 may perform at least one of a program, read and erase operations on a selected memory block under the control of the control logic 300.

Individual operations will be described below.

A program operation may be performed on a page basis. A page means a group of memory cells coupled to a single word line. For example, a number of pages identical to the number of word Ones may be included in each of the memory blocks. The program operation may be performed using an incremental step pulse program (ISPP) method in which a program voltage is increased step by step.

An erase operation may be performed as an entire erase operation or a partial erase operation. The entire erase operation denotes an operation in which all memory cells included in a selected memory block are erased, and the partial erase operation denotes an operation in which only some memory cells, among memory cells included in the selected memory block, are erased. For example, each of the memory blocks may be divided into a plurality of sub-memory blocks, and a partial erase operation may be performed on at least one sub-memory block selected from among the plurality of sub-memory blocks, and all memory cells in the selected sub-memory block are erased.

A read operation may be adjusted depending not only on whether a partial erase operation has been performed on at least one selected memory block, but also on the position of the selected at least one sub-memory block. For example, when a memory block which is selected in a read operation is a block on which a partial erase operation has been performed, voltages to be used for the read operation may be adjusted depending on the position of at least one sub-memory block on which the partial erase operation has been performed.

The peripheral circuit 200 may be configured to generate voltages required for the above-described program, erase and read operations and apply various voltages to the selected memory block or the at least one selected sub-memory block. For this operation, the peripheral circuit 200 may include a voltage generation circuit 210, a row decoder 220, a page buffer unit 230, a column decoder 240, an input/output (I/O) circuit 250, and a current sensing circuit 260.

Individual circuits are described in detail below.

The voltage generation circuit 210 may generate various operating voltages Vop used for program, read, and erase operations in response to an operation signal OP_CMD. For example, the voltage generation circuit 210 may generate a program voltage, a verification voltage, a verification pass voltage, a read voltage, a read pass voltage, an erase voltage, a turn-on voltage, etc.

The row decoder 220 may transfer the operating voltages Vop to word lines WL coupled to a selected memory block in response to a row address RADD received from the control logic. Although not shown in FIG. 2 the row decoder 220 may transfer the operating voltages Vop to the word lines WL in response to the row address RADD, and may also transfer the operating voltages Vop to the source select lines, the drain select lines, the source line, and the pipelines, in addition to the word lines WL.

The page buffer unit 230 may include a plurality of page buffers PB1 to PBl. The number of the page buffers P61 to PBl may equal the number of the bit lines BL1 to BLl so that each buffer may be coupled to a corresponding bit line. The page buffers PB1 to PBl may be operated in response to page buffer control signals PBSIGNALS received from the control logic 300. For example, each buffer may PB1 to PBl may temporarily store data received through a corresponding bit line BL1 to BLl or may sense voltages or currents on the corresponding bit line BL1 to BLl during a read or verify operation.

During a read operation, the page buffer unit 230 may precharge the bit lines BL1 to BLl by applying a positive voltage to the bit lines BL1 to BLl, and may sense the voltages of the bit lines BL1 to BLl, which vary depending on the threshold voltages of the memory cells. During an operation of precharging the bit lines BL1 to BLl, the page buffer unit 230 may adjust the level of a precharge voltage (i.e., identical to a bit line voltage) applied to the bit lines BL1 to BLl. The level of the precharge voltage may be adjusted by varying the turn-on voltages of some switches that are used to transfer the precharge voltage to the bit lines BL1 to BLI, among switches (S1-SI; e.g., transistors) included in the page buffer unit 230. For example, when the turn-on voltages of the switches are decreased, the level of the precharge voltage may also be decreased, whereas if the turn-on voltages are increased, the level of the precharge voltage may also be increased. That is, the precharge voltage is proportional to the turn-on voltages of the switches.

The column decoder 240 may transfer data between the I/O circuit 250 and the page buffer unit 230 in response to a column address CADD received from the control logic. For example, the column decoder 240 may exchange data with page buffers PB through data lines DL and may exchange data with the I/O circuit 250 through column lines CL.

The I/O circuit 250 may transfer a command CMD and an address ADD, received from the memory controller 1120 (see FIG. 1), to the control logic 300 or may exchange data DATA with the column decoder 240.

The current sensing circuit 260 may generate a reference current in response to a permission bit VRY_BIT<#> during a read operation or a verify operation, may compare a sensing voltage VPB, received from the page buffer unit 230, with a reference voltage generated based on the reference current, and may then output a pass signal PASS or a fail signal FAIL.

The control logic 300 may control the peripheral circuit 200 by outputting the operation signal OP_CMD, the row address RADD, the page buffer control signals PBSIG- NALS, and the permission bit VRY_BIT<#> in response to the command CMD and the address ADD. The control logic 300 may determine whether a verify operation has passed or failed in response to a pass or fail signal PASS or FAIL. In particular, during an erase operation, the control logic 300 may determine whether a partial erase operation has been performed on a selected memory block. Furthermore, when there is a sub-memory block on which the partial erase operation has been performed, the control logic 300 may control the peripheral circuit 200 so that voltages to be used for a read operation may be adjusted depending on the position of a target sub-memory block to be read and the number of sub-memory blocks on which the partial erase operation has been performed. For example, the control logic 300 may adjust the bit line voltage to be used for a read operation depending on the position of a target sub-memory block to be read and the number of sub-memory blocks on which a partial erase operation has been performed.

Figure 3:
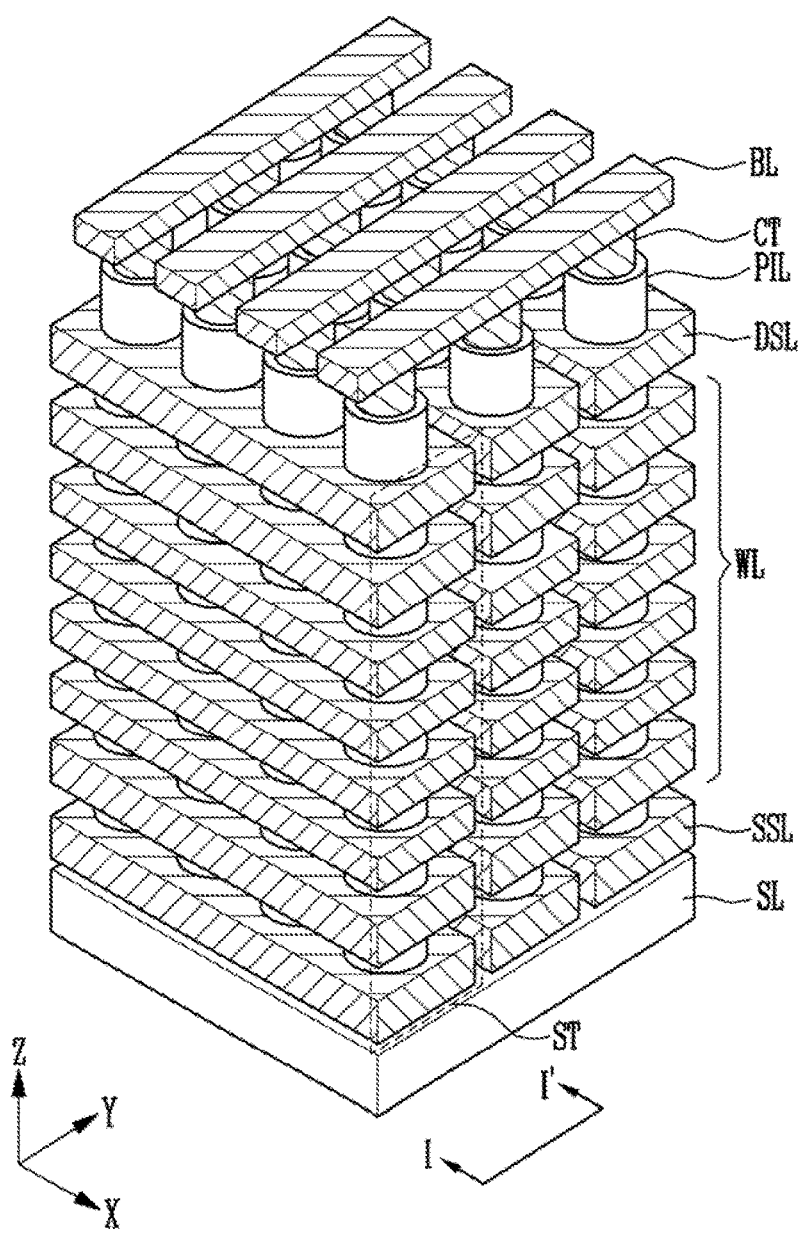
FIG. 3 is a perspective view illustrating an embodiment of a memory block configured in a three-dimensional (3D) structure.

FIG. 3 is a perspective view illustrating an embodiment of a memory block configured in a three-dimensional (3D) structure.

Referring to FIG. 3, a memory block implemented in a 3D structure may be formed in an "I" shape that is vertical to a substrate (i.e., in a Z direction), and may include a plurality of cell strings ST arranged between a plurality of bit lines BLs and a source line SL. Such a structure is also referred to as a "Bit Cost Scalable (BiCS) structure". For example, when the source line SL is formed horizontally on the top of the substrate, cell strings ST having the BiCS structure may be formed vertically on the top of the source line SL. More specifically, the 3D-structure may include at least one source select line SSL, a plurality of word lines WL, and at least one drain select line DSL, which are arranged in a first direction (i.e., a Y direction) and which are stacked on top of each other while being spaced apart from each other. The numbers of source select lines SSL, word lines WL and drain select lines DSL are not limited to the numbers shown in FIG. 3, and may differ according to the type of memory device.

The 3D structure may include a plurality of pillars PIL extending in the Z direction spaced apart along the X and the Y directions at regular intervals. Each pillar PIL vertically penetrates through the source select lines SSL, the word lines WL, and the drain select lines DSL. A plurality of bit lines BL extending in the Y direction are spaced apart along the X direction in a parallel orientation to each other. Each bit line BL is vertically aligned over a row of pillars PIL and contacts each of the pillars PIL in the row via a contact plug CT. Hence, a plurality of contact plugs CT may be formed between the bit lines BL and the pillars PIL, with the number of contact plugs CT equaling the number of bit lines BL.

Each pillar PIL may include a vertical channel layer and a memory layer. For example, the memory layer may be formed in a cylindrical shape along the inner circumferential surfaces of vertical holes vertically formed through the source select lines SSL, the word lines WL, and the drain select fines DSL. A cylindrical vertical channel layer may be formed inside the memory layer. When the vertical channel layer is formed in a cylindrical shape, the inside of the vertical channel layer may be filled with a vertical insulating layer. The vertical channel layer may be implemented as a polysilicon layer. The memory layer may be formed in the shape of a cylinder that encloses the vertical channel layer, and may include a tunnel insulating layer, a charge trap layer, and a blocking layer. In the memory layer, portions being in contact with the word lines WL may be the memory cells. Further, a structure in which a single pillar PIL is included in a single cell string ST is referred to as a 'single stack structure', and a structure in which a plurality of pillars are stacked is referred to as a 'multi-stack structure'. Contact plugs CT may be further formed between the bit lines BL and pillars PIL.

Figure 4:
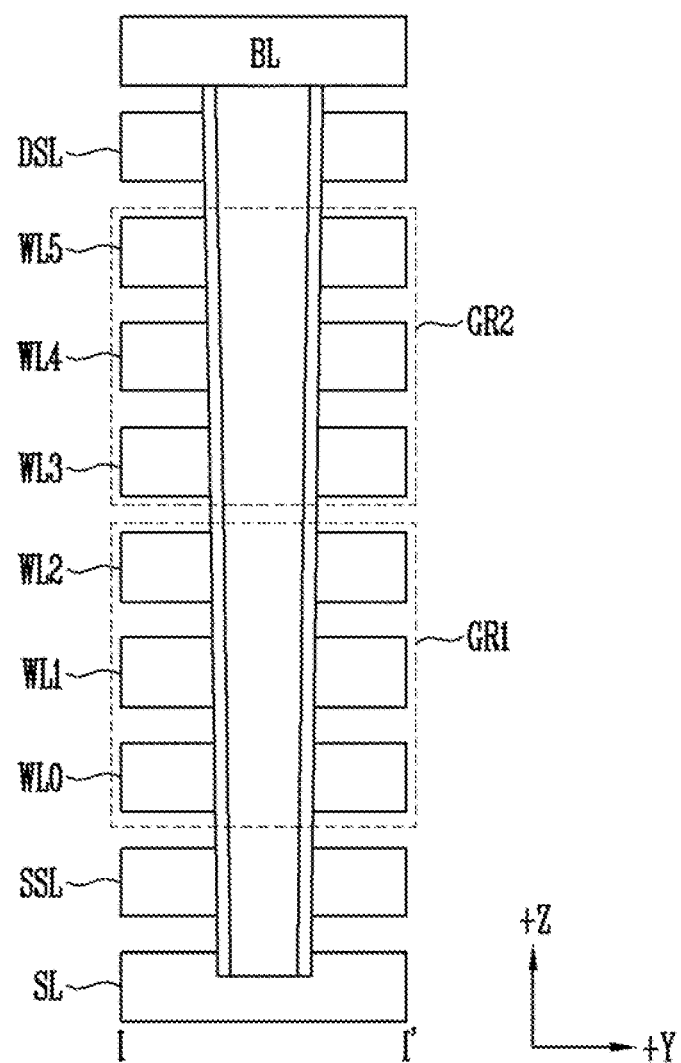
FIG. 4 is a diagram illustrating a cell string formed in a single stack structure.

FIG. 4 is a diagram illustrating a cell string formed in a single stack structure.

Referring, to FIG. 4, word lines WL0 to WL5 may be stacked between a source select line SSL and a bit line BL. FIG. 4 illustrates an exemplary configuration. the number of individual lines SL, SSL, WL0 to WL5, DSL, and BL may differ on design. Due to the characteristics of a manufacturing process, the width of a pillar PIL may be narrowed in a direction from the top to bottom of the pillar PIL. In the present embodiment, memory cells coupled to the word lines WL0 to WL5 may be grouped into a plurality of sub memory blocks GR1 and GR2. For example, according to a sequence in which the word lines are sequentially stacked from the bottom thereof, memory cells coupled to first to third word lines WL0 to WL2 may be defined as a first sub-memory block GR1, and memory cells coupled to fourth to sixth word lines WL3 to WL5 may be defined as a second sub-memory block GR2. When a partial erase operation is performed, the first or second sub-memory block may be selectively erased.

Even if the same program operation is performed on memory cells included in the cell string, a difference between threshold voltages may occur depending on the positions of the memory cells and the sequence of a program operation. Further, when a partial erase operation is performed, the threshold voltages of memory cells in a sub- memory block, which is not erased, may vary differently depending on the position of a sub-memory block on which the partial erase operation has been performed. Such a difference between the threshold voltages may occur due to back pattern dependency. For example, due to the back pattern dependency the threshold voltages of the memory cells may be decreased.

Various cases where threshold voltages vary due to back pattern dependency will be described in detail below.

Figure 5A:
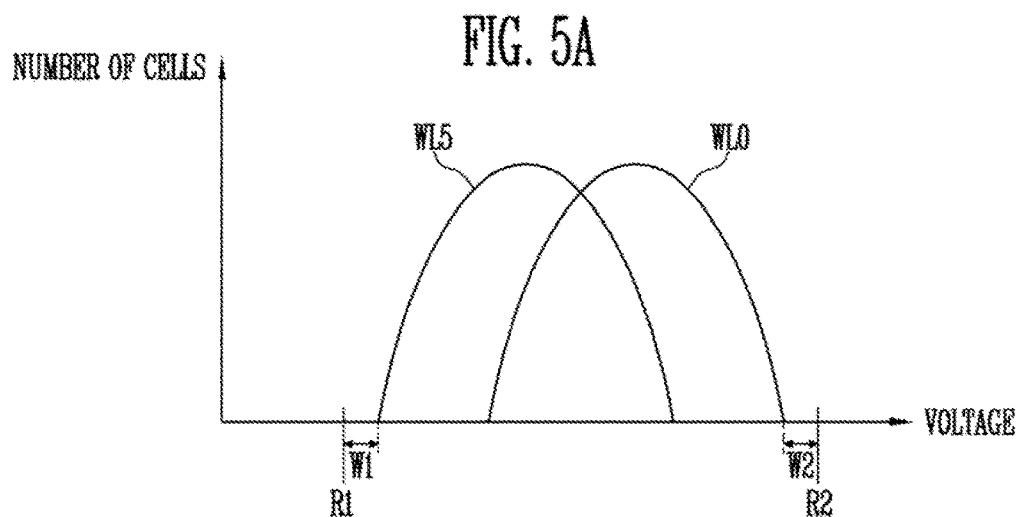
FIG. 5A is a diagram illustrating the distribution of threshold voltages of memory cells included in a memory block on which a partial erase operation is not performed.
Figure 5B:
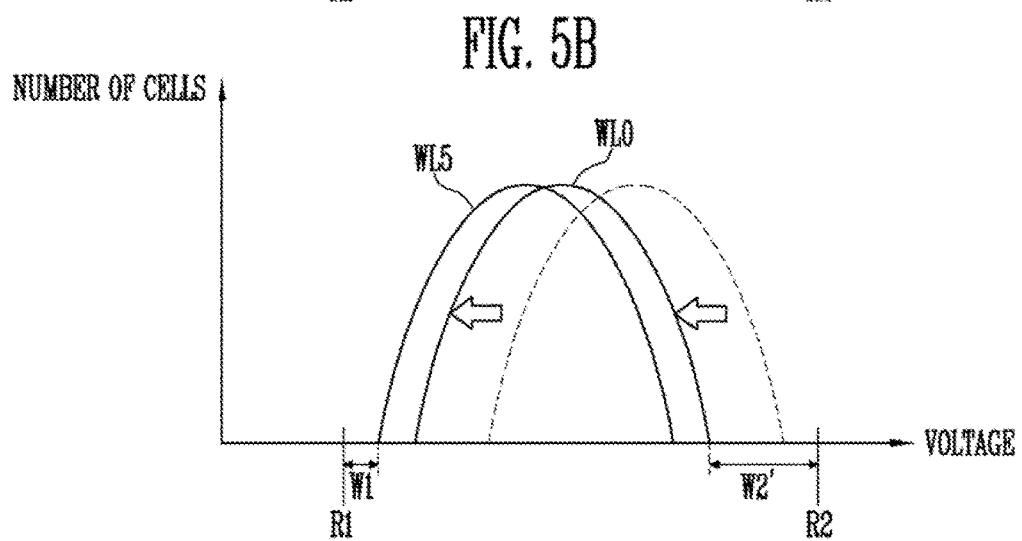
FIGS. 5B and 5C are diagrams illustrating a difference between the distributions of threshold voltages of memory cells depending on the position at which a partial erase operation has been performed.
Figure 5C:
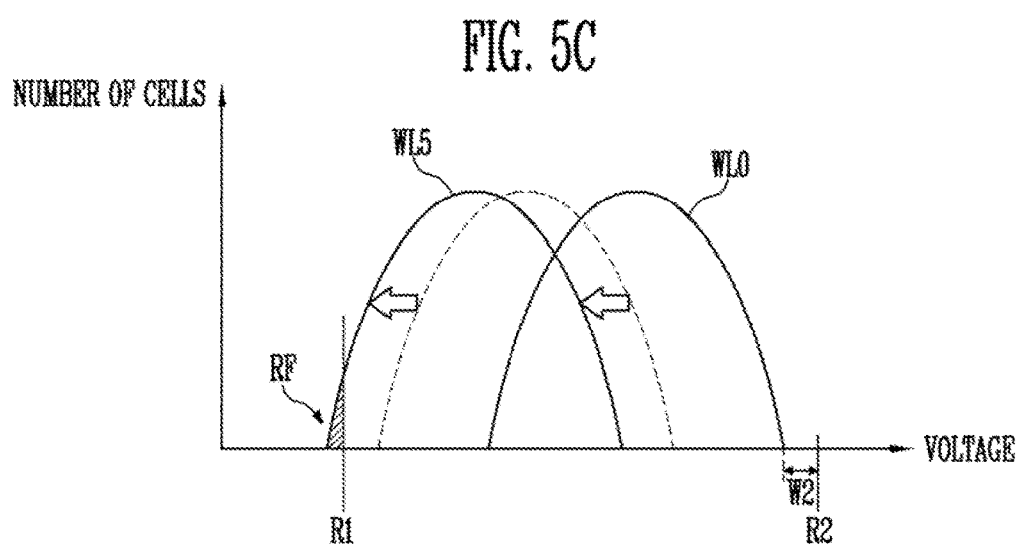

FIG. 5A is a diagram illustrating the distribution of threshold voltages of memory cells included in a memory block on which a partial erase operation is not performed, and FIGS. 5B and 5C are diagrams illustrating a difference between the distributions of threshold voltages of memory cells depending on the position at which a partial erase operation has been performed.

FIGS. 5A to 5C illustrate a case where a program operation is performed in a direction from a source select line SSL to a drain select line DSL in FIG. 4 by way of example.

Referring to FIGS. 4 and 5A, in a memory block on which a partial erase operation is not performed, threshold voltages become lower as the positions of the memory cells change in a direction from the bottom to the top of the memory block. For example, when a first word line WL0 is disposed at a lowermost position, and a sixth word line WL5 is disposed at an uppermost position, the threshold voltages of memory cells coupled to the sixth word line WL5 have levels lower than those of the threshold voltages of memory cells coupled to the first word line WL0. In consideration of a highest threshold voltage and a lowest threshold voltage, a first read voltage R1, and a second read voltage R2 may be set. The first read voltage R1 is lower than the threshold voltages of memory cells coupled to the sixth word line WL5 and the second read voltage R2 is higher than the threshold voltages of memory cells coupled to the first word line WL0. In consideration of back pattern dependency of the memory cells, a margin corresponding to a first interval W1 may be present between the threshold voltages of the memory cells coupled to the sixth word line WL5 and the first read voltage R1, and a margin corresponding to a second interval W2 may be present between the threshold voltages of the memory cells coupled to the first word line WL0 and the second read voltage R2.

FIG. 5B is a diagram illustrating back pattern dependency when a partial erase operation is performed on a sub-memory block located in an upper portion of a memory block.

Referring to FIGS. 4 and 5B, a case where a partial erase operation is performed on memory cells included in the second sub-memory block GR2, among the memory cells included in the first and second sub-memory blocks GR1 and GR2, will be described by way of example.

When a partial erase operation is performed on the memory cells included in the second sub-memory block GR2, the threshold voltages of the memory cells included in the first sub-memory block GR1 may be decreased due to the influence of the partially erased memory cells (e.g., back pattern dependency). When the threshold voltages of the memory cells included in the first sub-memory block GR1 are decreased, an interval W2' from the second read voltage R2 is increased, and thus a read failure attributable to the second read voltage R2 does not occur. However, the threshold voltages of the memory cells included in the first sub-memory block GR1 may be approximate to the first read voltage R1. However, a difference between the threshold voltages of the memory cells included in the first sub-memory block GR1 and the first read voltage R1 is sufficiently large since before the partial erase operation is performed on the second sub-memory block GR2. As a result, the threshold voltages of the memory cells included in the first sub-memory block GR1 are not lower than the first read voltage R1 even if they are decreased due to back pattern dependency.

Therefore, the partial erase operation performed on the second sub-memory block GR2 does not influence a read operation on the memory cells included in the first sub-memory block GR1.

FIG. 5C is a diagram illustrating back pattern dependency when a partial erase operation is performed on a sub-memory block located in a lower portion of a memory block.

Referring to FIGS. 4 and 5C, a case where a partial erase operation is performed on memory cells included in the first sub-memory block GR1, among the memory cells included in the first and second sub-memory blocks GR1 and GR2, will be described by way of example.

When a partial erase operation is performed on the memory cells included in the first sub-memory block GR1, the threshold voltages of the memory cells included in the second sub-memory block GR2 may be decreased due to back pattern dependency. Due thereto, a margin between the threshold voltages of the memory cells included in the second sub-memory block GR2 and the first read voltage R1 is decreased, and the threshold voltages of some memory cells may become lower than the first read voltage R1, and thus a read failure (RF) may occur.

Further, when three or more sub-memory blocks are included in a single memory block, the currents of channels may change depending on the number of sub-memory blocks on which the partial erase operation has been performed. Accordingly, a bit line voltage may be adjusted depending on the number of erased sub-memory blocks.

Accordingly, in order to suppress a read failure attributable to a partial erase operation, the present embodiment may perform a read operation as follows.

Figure 6:
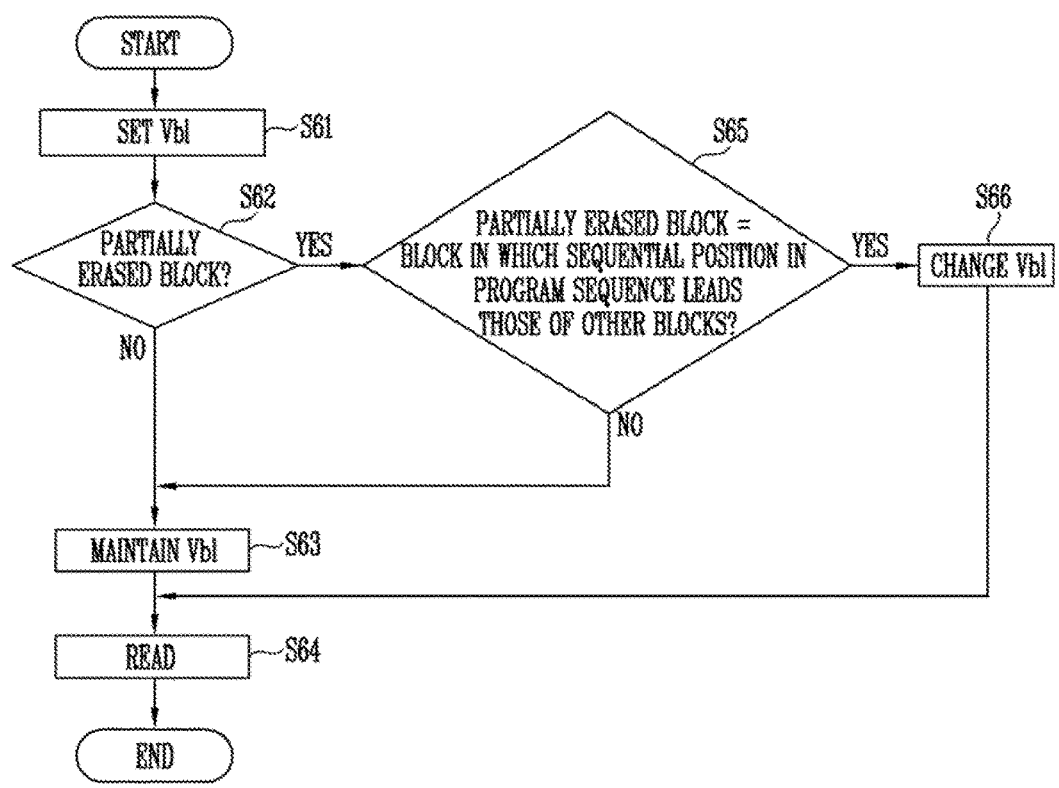
FIG. 6 is a flowchart illustrating a read operation according to an embodiment of the present disclosure.

FIG. 6 is a flowchart illustrating a read operation according to an embodiment of the present disclosure.

Referring to FIG. 6, when a read operation on a selected memory block is initiated, a bit line voltage Vbl for pre-charging bit lines is set at step S61. The bit line voltage Vbl set at step S61 may be set to a default value in a memory device.

Whether a selected memory block is a block on which a partial erase operation has been performed is determined at step S62. In some embodiments, information about the partial erase operation on the memory block may be stored in one or more flag cells of each memory block. For example, whether a partial erase operation has been performed on the selected memory block may be determined by reading data from flag cells included in the flag block of the selected memory block. Alternatively, information about the partial erase operation may be stored in a storage unit (not shown) included in the memory device. For example, the storage unit storing the information about the partial erase operation may be part of the control logic 300 of the memory device 1110 of FIG. 2. In this case, the control logic 300 may determine whether a partial erase operation has been performed on the selected memory block, based on data stored therein, and may control the peripheral circuit 200 based on the result of the determination.

If it is determined that a partial erase operation has not been performed on the selected memory block (in case of "No" of the step S62), the bit line voltage Vbl set at step S61 is maintained at step S63. Then a read operation using the corresponding bit line voltage Vbl may be performed at step S64. Here, the bit line voltage Vbl denotes a voltage required to precharge the bit lines for a read operation.

If it is determined that a partial erase operation has been performed on the selected memory block (in case of "Yes" of the step S62), it is determined whether the sequential position of the sub-memory block, on which the partial erase operation has been performed, in the program sequence leads those of other sub-memory blocks in the program sequence at step S65. Referring to FIG. 4 as an example, assuming that a program operation is performed in a direction from the first word line WL0 to the sixth word line WL5 a sub-memory block included in the first sub-memory block GR1 is a block having a sequential position in the program operation sequence, which leads that of a sub-memory block included in the second sub-memory block GR2, and the second sub-memory block GR2 is a block having a sequential position in the program operation sequence, which lags behind that of the first sub-memory block GR1.

If it is determined that the sequential position of the sub-memory block, on which the partial erase operation has been performed, in the program operation sequence lags behind those of other sub-memory blocks in the program operation sequence (in case of "No" of the step S62), the bit line voltage Vbl set at step S61 is maintained at step S63.

If it is determined that the sequential position of the sub-memory block on which the partial erase operation has been performed, in the program operation sequence leads those of other sub-memory blocks in the program operation sequence (in case of "Yes" of the step S65), the bit line voltage Vbl is changed at step S66. For example, the bit line voltage Vbl may be changed to a bit line voltage having a level lower than that of the voltage set at step S61. That is, the sequential position of a sub-memory block, selected for a read operation, in the program operation sequence lags behind that of a partially erased memory block, the bit line voltage Vbl is changed to prevent the occurrence of a read failure (RF). For this operation, the bit line voltage Vbl, required to precharge the bit lines when a read operation is performed on the selected sub-memory block, may be lower than a voltage set to a default voltage level (e.g., the bit line voltage set at step S61). More specifically, at step S66, the bit line voltage Vbl may be changed to a voltage, which is lower than the bit line voltage Vbl set at step S61 and is higher than 0 V.

Further, the number of sub-memory blocks on which the partial erase operation has been performed at the above-described step S65 may be additionally determined, and the bit line voltage Vbl may be additionally changed according to the determined number of sub-memory blocks at step S66.

Based on the above description, a more detailed embodiment will be described below.

Figure 7:
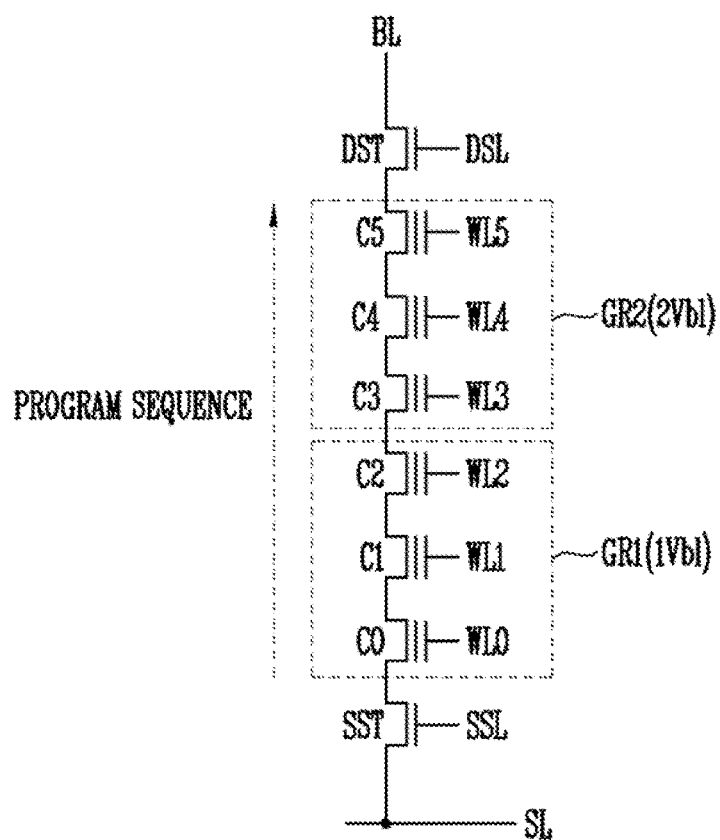
FIG. 7 is a diagram for explaining a read operation according to an embodiment of the present disclosure.

FIG. 7 is a diagram for explaining a read operation according to an embodiment of the present disclosure.

Referring to FIG. 7 it is assumed that a program operation is performed in a direction from a first memory cell C0 to a sixth memory cell C5. When a partial erase operation is not performed on first and second sub-memory blocks GR1 and GR2, a read operation may be performed on the first to sixth memory cells C0 to C5. At this time, a voltage set to precharge bit lines is assumed to be a first bit line voltage 1Vbl.

When a partial erase operation is performed on the second sub-memory block GR2, a read operation may be performed on the memory cells C0 to C2 included in the first sub-memory block GR1. The threshold voltages of the memory cells C0 to C2 included in the first sub-memory block GR1 may be decreased due to back pattern dependency attributable to the partial erase operation performed on the second sub-memory block GR2, but the decreased threshold voltages are not sufficiently low to cause a read failure (see FIG. 5B), and thus the first bit line voltage 1Vbl may be used without change.

When a partial erase operation is performed on the first sub-memory block GR1, a read operation may be performed on the memory cells C3 to C5 included in the second sub-memory block GR2. The threshold voltages of the memory cells C3 to C5 included in the second sub-memory block GR2 may be decreased due to back pattern dependency attributable to the partial erase operation performed on the first sub-memory block GR1. At this time, a read failure may occur (see FIG. 5C), and thus a second bit line voltage 2Vbl lower than the first bit line voltage 1Vbl may be used.

Figure 8:
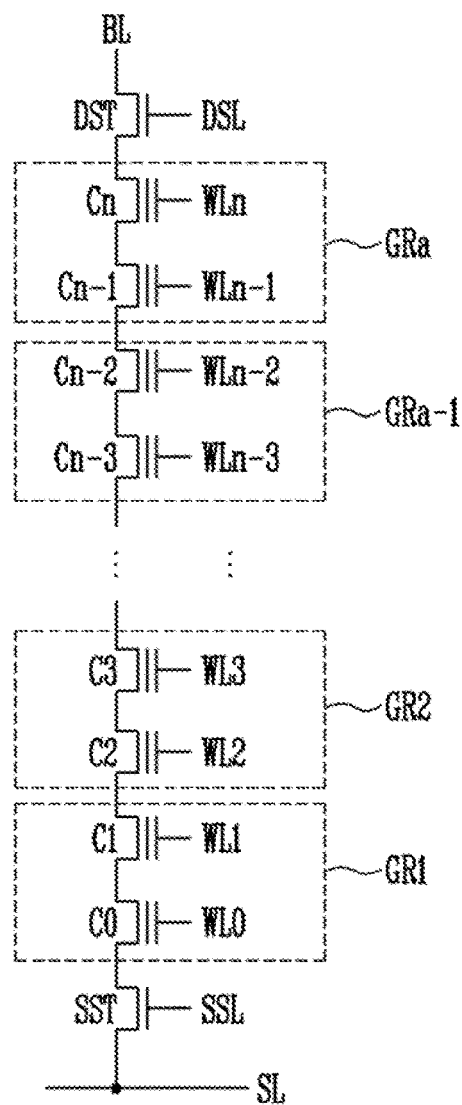
FIG. 8 is a diagram for explaining a read operation according to another embodiment of the present disclosure.

FIG. 8 is a diagram for explaining a read operation according to another embodiment of the present disclosure.

Below, a read operation performed when three or more sub-memory blocks are included in a single memory block will be described with reference to FIG. 8.

When first to (n+1)-th memory cells C0 to Cn are included in a single cell string, the first to (n+1)-th memory cells C0 to Cn may grouped into a plurality of sub-memory blocks GR1 to GRa (where a is a positive integer) according to the position thereof. In FIG. 8 it is assumed that a program operation is performed in the sequence of sub-memory blocks from the first sub-memory block GR1 to the a-th sub-memory block GRa.

TABLE 1

|  |  | Target sub-memory block to be read | | | |
|---|---|---|---|---|---|
|  |  | GRa | GRa-1 | ... GR2 | GR1 |
| Number of erased sub-memory blocks | (a − 1) | Vbl_a(a − 1) | Vbl_(a − 1)(a − 1) | ... Vbl_2(a − 1) | Vbl_1(a − 1) |
|  | ... | ... | ... | ... ... | ... |
|  | 2 | Vbl_a2 | Vbl_(a − 1)2 | ... Vbl_22 | Vbl_12 |
|  | 1 | Vbl_a1 | Vbl_(a − 1)1 | ... Vbl_21 | Vbl_11 |

Referring to Table 1, the bit line voltage Vbl may be adjusted depending on the position of the target sub-memory block to be read and the number of erased sub-memory blocks. For example, as the target sub-memory block to be read is located at a relatively higher sequential position, the bit line voltage Vbl may be adjusted to a lower voltage. Further, as the number of erased sub-memory blocks is larger, the currents of channels may be further increased; thus, the bit line voltage Vb1 may be adjusted to a lower voltage.

For example, when the number of erased sub-memory blocks is 1 and the first sub-memory block GR1 is a target block to be read, an 11-th bit line voltage Vbl_11 which is a highest bit line voltage, may be set. When the number of erased sub-memory blocks is 1 and the a-th sub-memory block GRa is a target block to be read, a lowest bit line voltage in a state in which the number of erased sub-memory blocks is 1, that is, an a1-th bit line voltage Vbl_a1 (where a is a positive integer), may be set. That is, as the set bit line voltage changes in a direction from the 11-th bit line voltage Vbl_11 to the a1-th bit line voltage Vbl_a1, the voltage may be gradually decreased.

Further, when the number of erased sub-memory blocks is 'a−1' and the first sub-memory block GR1 is a target block to be read, a highest bit line voltage in a state in which the number of erased sub-memory blocks is 'a−1' that is, a 1(a−1)-th bit line voltage Vbl_1(a−1) may be set. When the number of erased sub-memory blocks is 'a−1', and the a-th sub-memory block GRa is a target block to be read, a lowest bit line voltage in a state in which the number of erased sub-memory blocks is 'a−1', that is, an a(a−1)-th bit line voltage Vbl_a(a−1), may be set.

That is, as the number of partially erased sub-memory blocks becomes larger, and the target memory block to be read is located at a higher position, the bit line voltage Vbl may be adjusted to a lower voltage.

Figure 9:
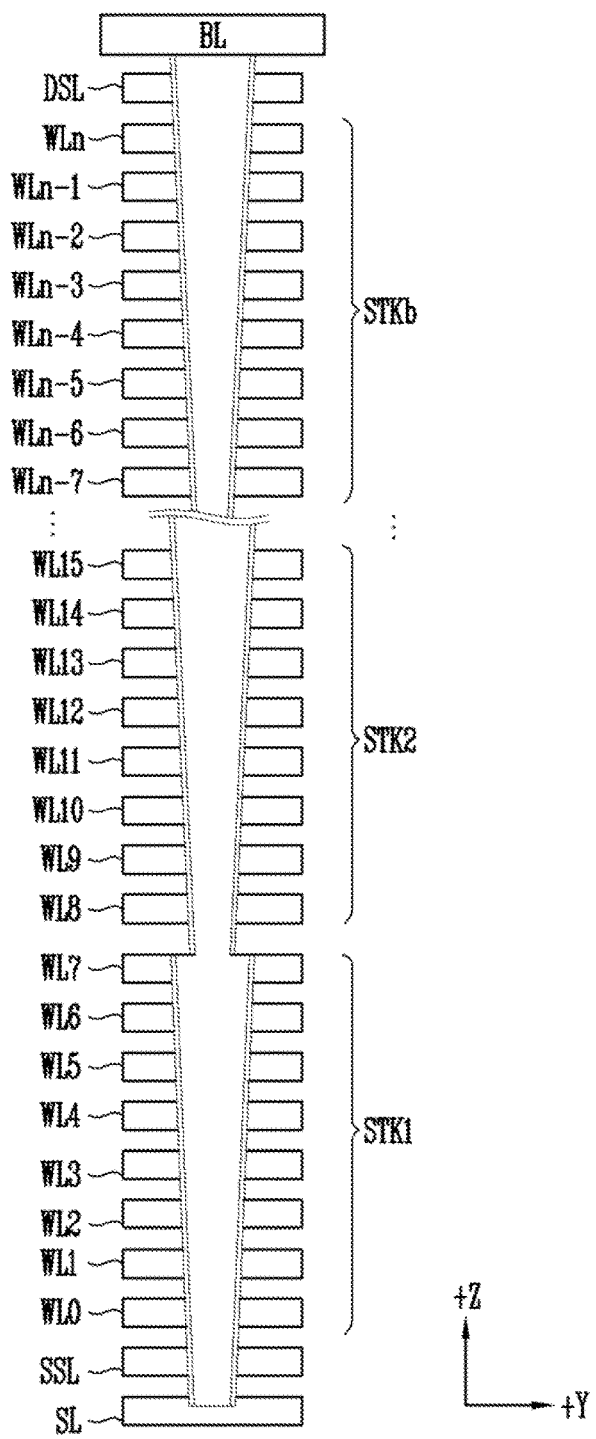
FIG. 9 is a diagram illustrating a cell string formed in a multi-stack structure.

FIG. 9 a diagram illustrating a cell string formed in a multi-stack structure, wherein the cell string is described using the section of a single cell string.

Referring to FIG. 9, a multi-stack structure means a structure in which multiple stacks STK1 to STKb (where b is a positive integer) are stacked between a source select line SSL adjacent to a source line SL and a drain select line DSL adjacent to a bit line BL. In such a multi-stack structure, the widths of pillars included in the stacked stacks STK1 to STKb may differ from each other. For example, each of the stacks STK1 to STKb may have a pillar, which is widest at the top thereof and is then narrowed in a direction from the top to the bottom thereof.

In the multi-stack structure, each of the stacks STK1 to STKb may be set to be a single sub-memory block. Therefore, as shown in FIG. 8 the bit line voltage may be adjusted depending on the number of sub-memory blocks and the position of a target sub-memory block to be read. For example, as the sequential position of the target sub-memory block to be read in the program operation sequence lags behind that of a partially erased sub-memory block in the program operation sequence, and as the number of partially erased sub-memory blocks is larger, the bit line voltage may be set to a lower voltage. Alternatively, when a target sub-memory block to be read is located above partially erased sub-memory blocks, and the number of partially erased sub-memory blocks is larger, the bit line voltage may be set to a lower voltage.

Figure 10:
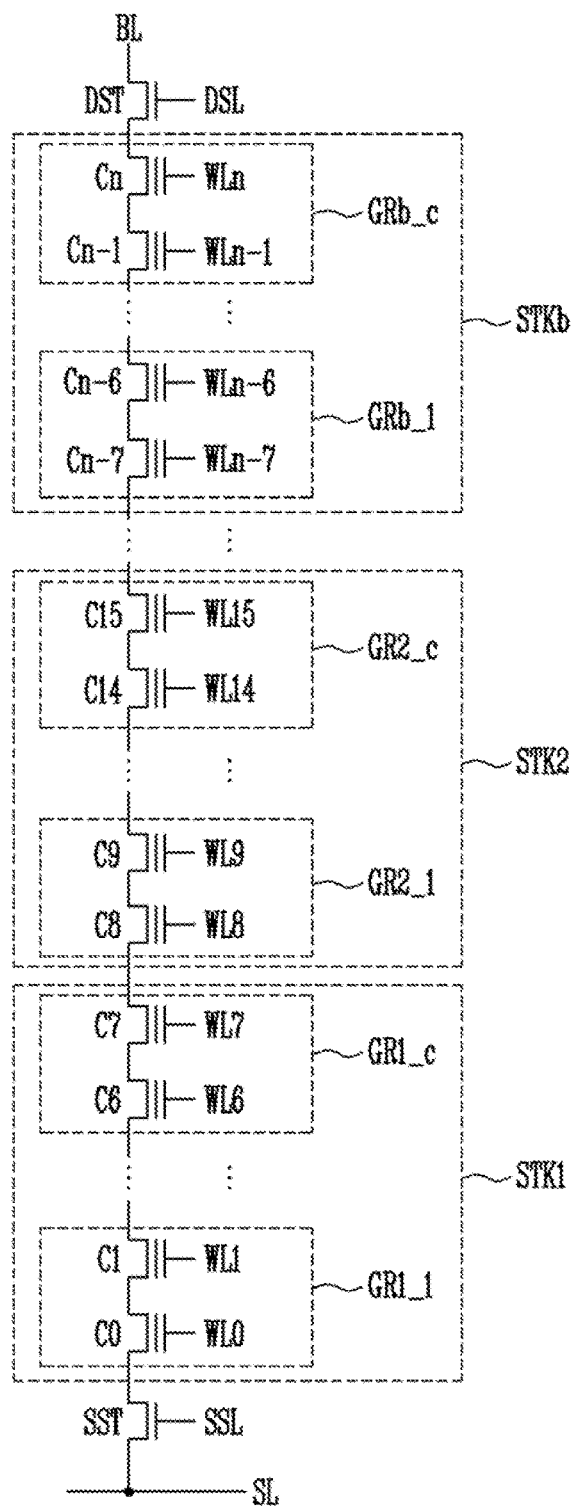
FIG. 10 is a diagram illustrating another embodiment of a read operation of a memory device including the cell string of FIG. 9.

FIG. 10 is a diagram illustrating another embodiment of a read operation of a memory device including the cell string of FIG. 9.

Referring to FIG. 10, stacks STK1 to STKb included in a multi-stack structure may be divided into a plurality of sub-memory blocks GR1_1 to GR1_c, GR2_1 to GR2_c, . . . , GRb_1 to GRb_c (where c is a positive integer), respectively. For example, the first stack STK1 may include 11-th to 1c-th sub-memory blocks GR1_1 to GR1_c, the second stack STK2 may include 21-th to 2c-th sub-memory blocks GR2_1 to GR2_c, and the b-th stack STKb may include b1-th to bc-th sub-memory blocks GRb_1 to GRb_c. As the sequential position of a target sub-memory block to be read in the program operation sequence lags behind that of a partially erased sub-memory block in the program operation sequence, and as the number of partially erased sub-memory blocks is larger, the bit line voltage may be set to a lower voltage.

Figure 11:
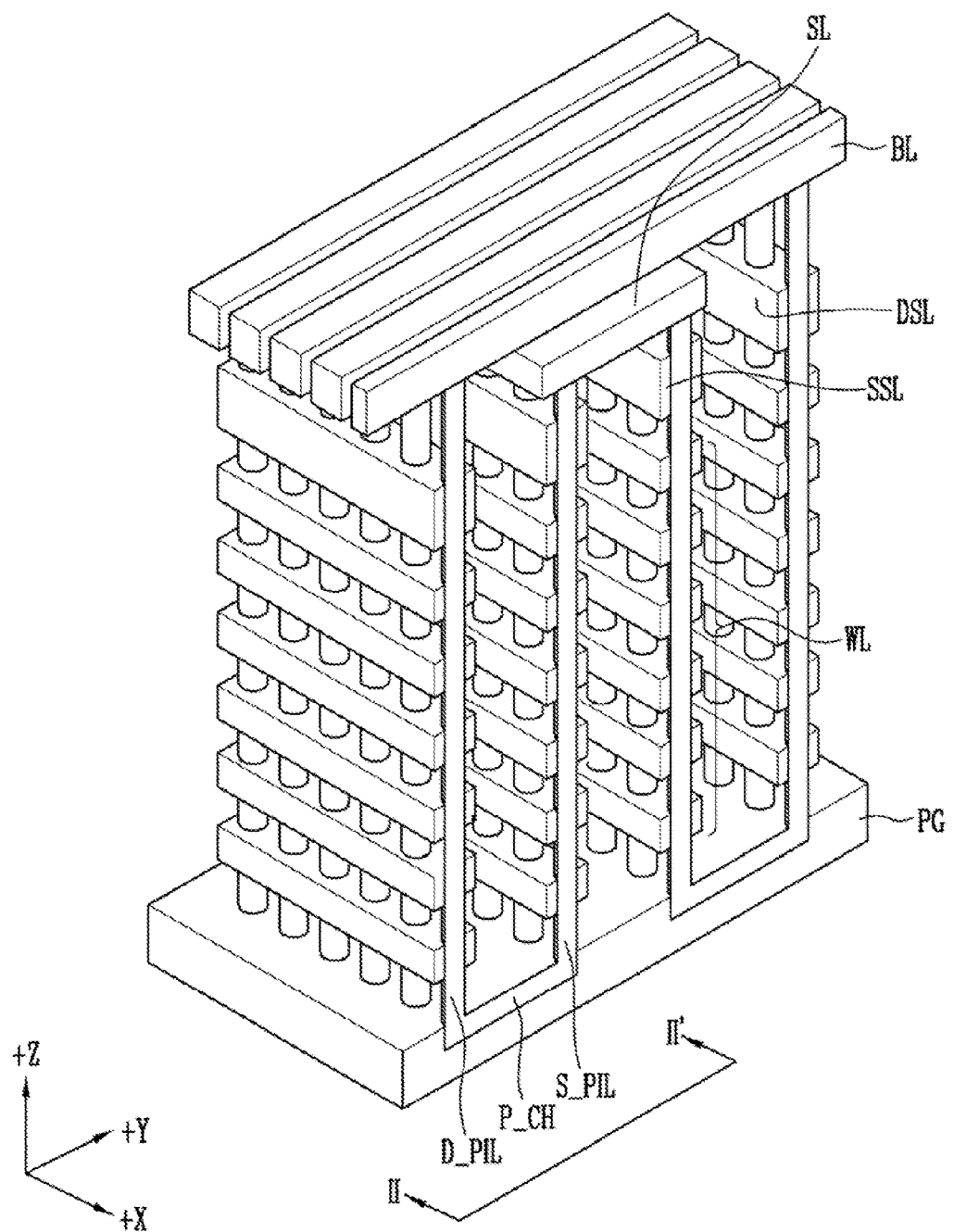
FIG. 11 is a perspective view illustrating another embodiment of a memory block configured in a three-dimensional (3D) structure.

FIG. 11 is a perspective view illustrating another embodiment of a memory block configured in a three-dimensional (3D) structure.

Referring to FIG. 11, a memory block implemented in the 3D structure may include cell strings, which are arranged vertically (in a Z direction) on a substrate and are extended in a "U" shape between bit lines BL and a source line SL. This structure is also referred to as a "Pipe-Bit Cost Scalable (P-BiCS) structure". For example, each cell string may include a drain pillar D_PIL coupled to a bit line BL, a source pillar S_PIL coupled to the source line SL, and a pipe channel layer P_CH for coupling the drain and source pillars D_PIL and S_PIL to each other. The drain and the source pillars S_PIL and S_PIL may extend in the Z direction whereas the pipe channel layer P_CH may extend in the Y direction. The top of the source pillar S_PIL is coupled to the source line SL, and the bottom of the source pillar S_PIL is coupled to the pipe channel layer P_CH. The top of the drain pillar D_PIL is coupled to a bit line BL and the bottom of the drain pillar D_PIL is coupled to the pipe channel layer P_CH.

The pipe channel layer P_CH may be formed in a pipe gate PG, and the source pillar S_PIL and the drain pillar D_PIL may be formed at opposite ends of the pipe channel layer P_CH in a direction vertical to the pipe gate PG. A plurality of word lines (e.g., WLp to WL0 of FIG. 12) and a source select line SSL, which are stacked while being spaced apart from each other, may be formed along the source pillar S_PIL. A plurality of word lines (e.g. WLp+1 to WLn of FIG. 12) and a drain select line DSL, which are stacked while being spaced apart from each other, may be formed along the drain pillar D_PIL.

In the above-described memory block configured in a 3D structure, cell strings arranged in a cross section taken along line II-II' will be described by way of example.

Figure 12:
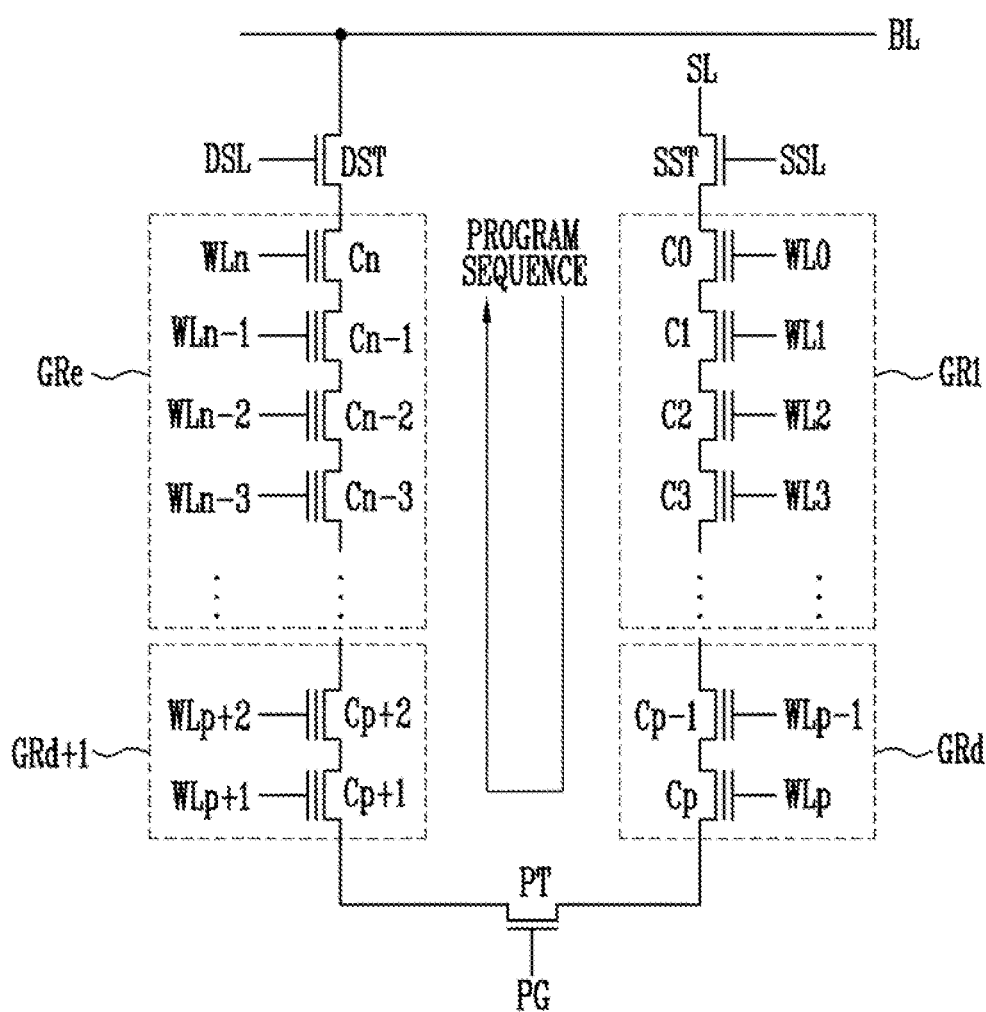
FIG. 12 is a diagram for explaining a read operation a memory device including the cell string of FIG. 11.

FIG. 12 is a diagram for explaining a read operation of a memory device including the cell string of FIG. 11.

Referring to FIG. 12, a case where a program operation is sequentially performed in a direction from a first memory cell C0 adjacent to a source select line SSL to an n-th memory cell Cn adjacent to a drain select line DSL is assumed. First to e-th sub-memory blocks GR1 to GRe (where e is a positive integer) may be sequentially defined in a direction from memory cells adjacent to the source select line SSL to memory cells adjacent to the drain select line DSL. In some embodiments, the number of memory cells included in each sub-memory block may differ. For example, the first sub-memory block GR1 may be a block on which a program operation is performed first, and the e-th sub-memory block GRe may be a block on which a program operation is performed last.

TABLE 2

|  |  | Target sub-memory block to be read | | | |
| --- | --- | --- | --- | --- | --- |
|  |  | GRe | GRd + 1 | GRd | GR1 |
| Number of erased sub-memory blocks | 3 | Vbl_43 | Vbl_33 | Vbl_23 | Vbl_13 |
|  | 2 | Vbl_42 | Vbl_32 | Vbl_22 | Vbl_12 |
|  | 1 | Vbl_41 | Vbl_31 | Vbl_21 | Vbl_11 |

Referring to Table 2, a bit line voltage Vbl may be adjusted depending on the position of the target sub-memory block to be read and the number of erased sub-memory blocks. For example as the target sub-memory block to be read is located at a higher position and the number of erased sub-memory blocks is larger, the bit line voltage Vbl may be adjusted to a lower voltage.

For example, as the number of erased sub-memory blocks is 1 and the first sub-memory block GR1 is a target block to be read, an 11-th bit line voltage Vbl_11, which is a highest bit line voltage, may be set. When the e-th sub-memory block GRe on which the program operation has been performed last is the target block to be read in a state in which the number of erased sub-memory blocks is 1, a 41-th bit line voltage Vbl_41 which is a lowest bit line voltage in the state in which the number of erased sub-memory blocks is 1, may be set. That is, as the set bitline voltage changes in a direction from the 11-th bit line voltage Vbl_11 to the 41-th bit line voltage Vb_41 the bit line voltage may be gradually decreased.

Further when the number of erased sub-memory blocks is 3, and the first sub-memory block GR1 is a target block to be read, a 13-th bit line voltage Vbl_13, which is a highest bit line voltage in a state in which the number of erased sub-memory blocks is 3, may be set. When the number of erased sub-memory blocks is 3 and the e-th sub-memory block GRe is a target block, to be read, a 43-th bit line voltage Vb1_43 which is a lowest bit line voltage in the state in which the number of erased sub-memory blocks is 3, may be set.

That is, as the number of partially erased sub-memory blocks is larger, and the target memory block to be read is located at a higher position, the bit line voltage Vbl may be adjusted to a lower voltage.

Figure 13:
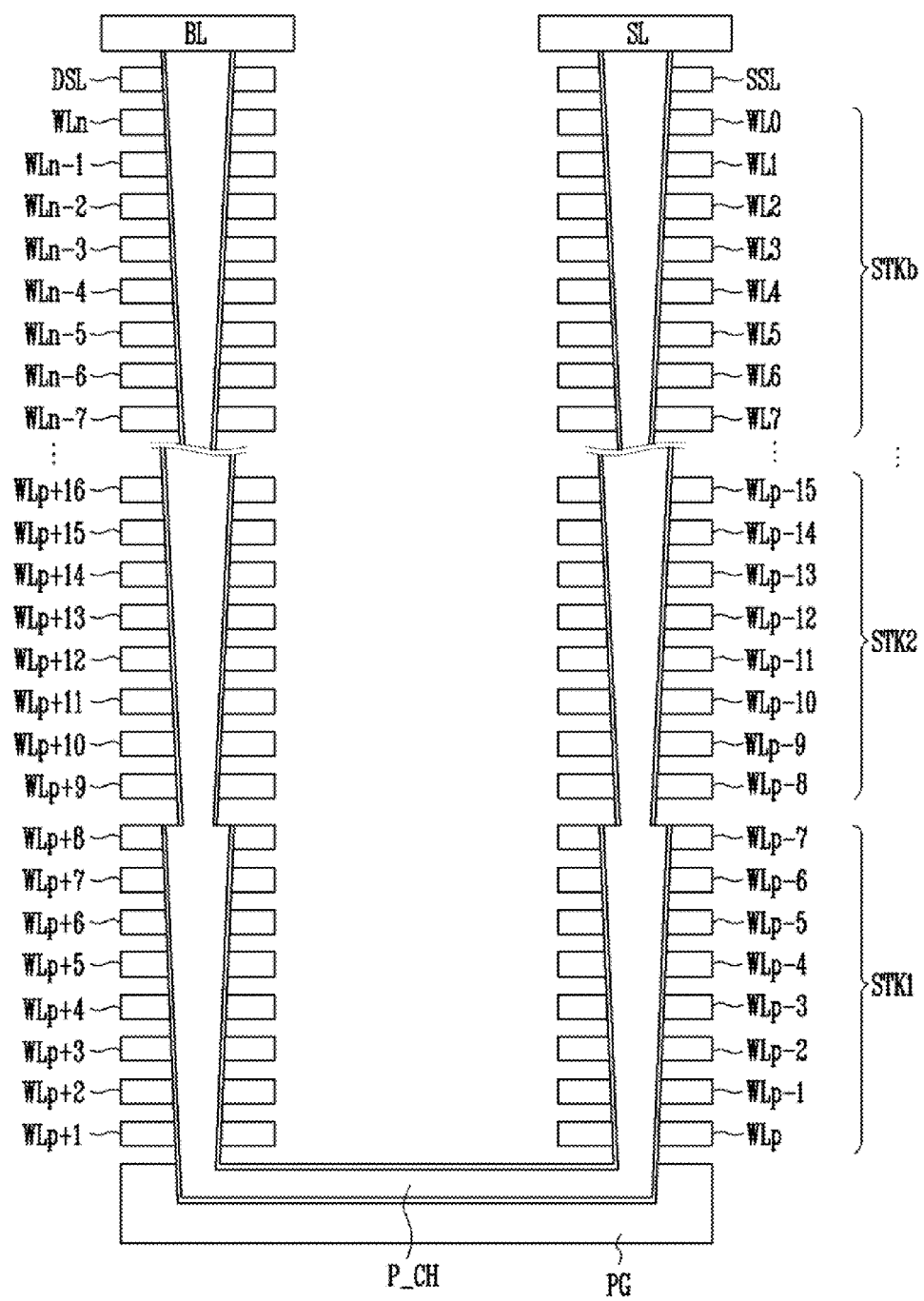
FIG. 13 is a diagram illustrating a cell string formed in a multi-stack structure.

FIG. 13 is a diagram illustrating a cell string formed in a multi-stack structure.

Referring to FIG. 13, the multi-stack structure denotes a structure in which a plurality of stacks STK1 to STKb are stacked between a pipe gate PG and a source select line SSL adjacent to a source line SL, and between a pipe gate PG and a drain select line DSL adjacent to a bit line BL. In such a multi-stack structure, the widths of pillars included in the stacks STK1 to STKb that are stacked may differ from each other.

In the multi-stack structure, each of the stacks STK1 to STKb may include two sub-memory blocks. For example, the first stack STK1 may include sub-memory blocks coupled to the bit line BL and sub-memory blocks coupled to the source line SL. Each of the remaining second to b-th stacks STK2 to STKb may include sub-memory blocks coupled to the bit line BL and sub-memory blocks coupled to the source line SL.

Therefore, as shown in FIG. 12, the bit line voltage may be adjusted depending on at least one of the number of sub-memory blocks and the position of a target sub-memory block to be read. For example, when the sequential position of a target sub-memory block to be read in a program operation sequence lags behind that of a partially erased sub-memory block in the program operation sequence, and the number of partially erased sub-memory blocks is larger, the bit line voltage may be set to a lower voltage. Further, when the target sub-memory block to be read is located above the partially erased sub-memory blocks and the number of partially erased sub-memory blocks is larger, the bit line voltage may be set to a lower voltage.

Figure 14:
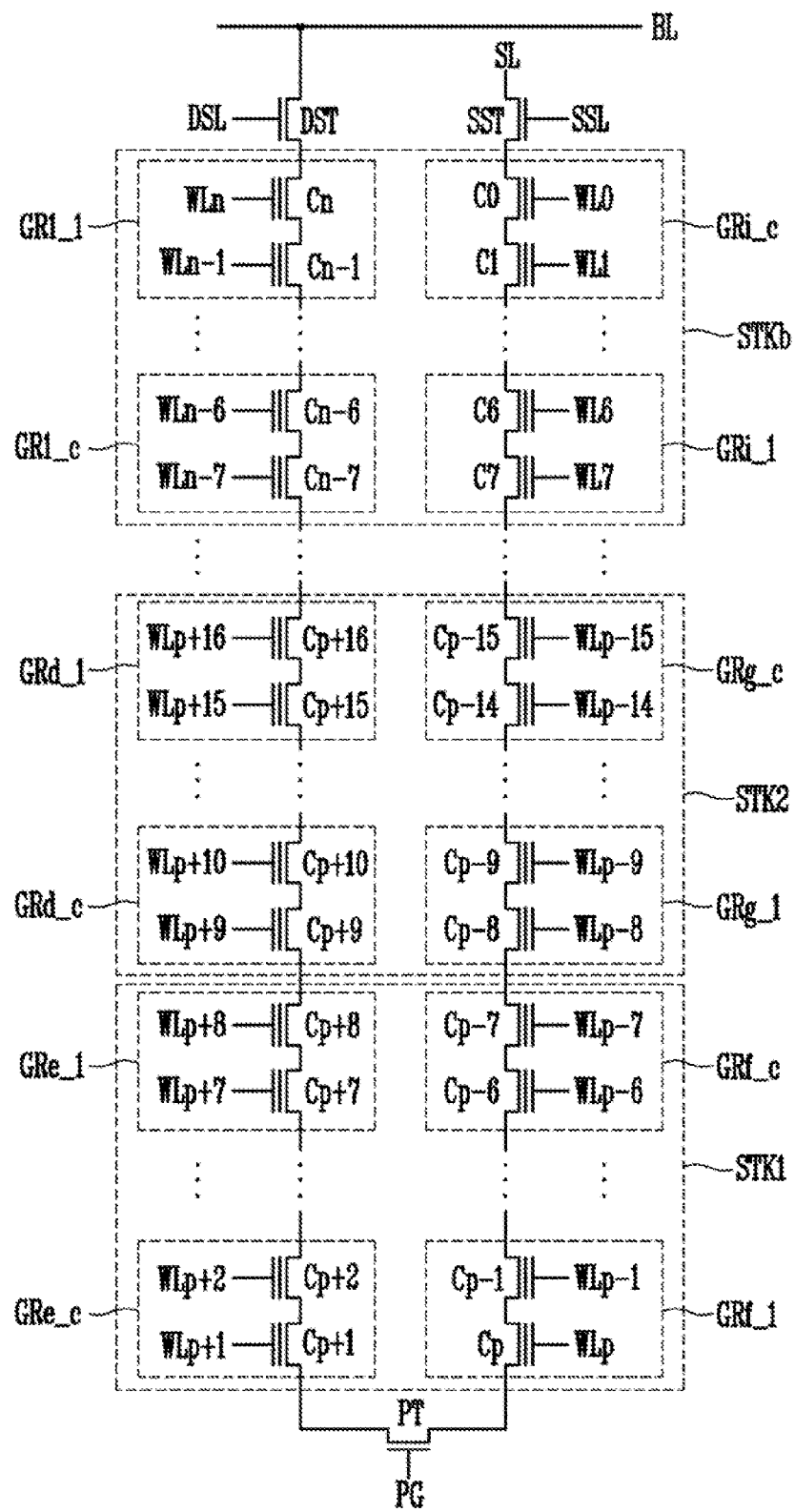
FIG. 14 is a diagram illustrating another embodiment of a read operation of a memory device including the cell string of FIG. 13.

FIG. 14 is a diagram illustrating another embodiment of a read operation of a memory device including the cell string of FIG. 13.

Referring to FIG. 14, stacks STK1 to STKb included in a multi-stack structure may be divided into a plurality of sub-memory blocks GR1_1 to GRi_c. It is assumed that a program operation is performed in the sequence of sub-memory blocks from the i_c-th sub-memory block GRi_c adjacent to a source line SL to a 11-th sub-memory block GR1_1 adjacent to a bit line BL. Even in the present embodiment, when the sequential position of a target sub-memory block to be read in a program operation sequence lags behind that of a partially erased sub-memory block in the program operation sequence and the number of partially erased sub-memory blocks is larger, the bit line voltage may be set to a lower voltage.

Figure 15:
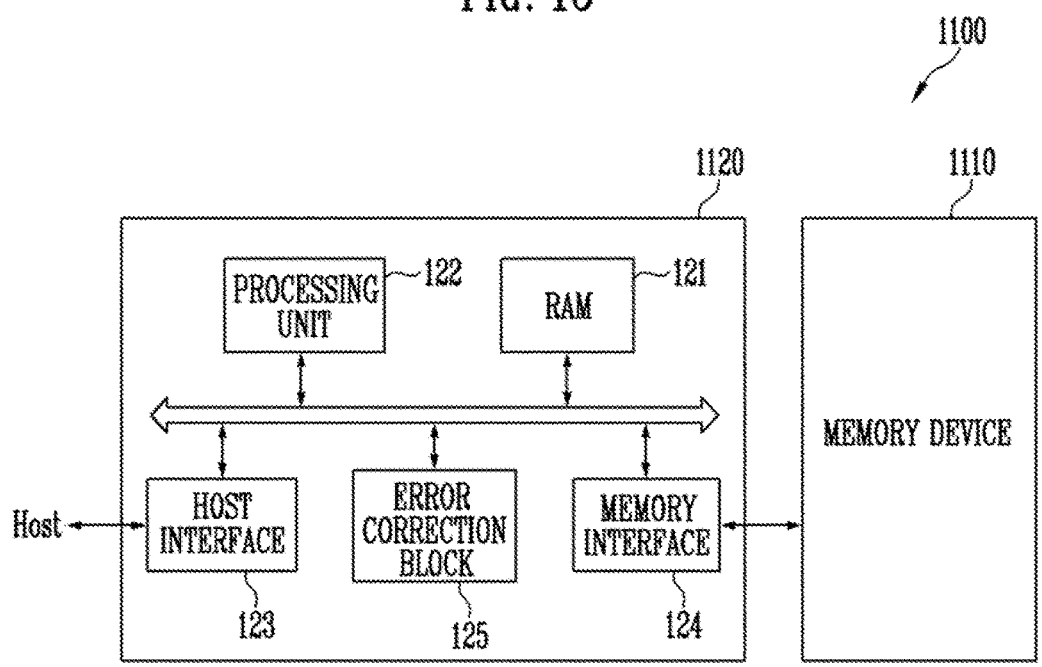
FIG. 15 is a block diagram illustrating an embodiment of memory system including the memory device of FIG. 2.

FIG. 15 is a block diagram illustrating an embodiment of a memory system 1100 including the memory device 1110 of FIG. 2.

Referring to FIG. 15, the memory system 1100 includes the memory device 1110 and a memory controller 1120. A repeated description of the memory device 1110 will be omitted here.

The memory controller 1120 is coupled to a host and the memory device 1110. The memory controller 1120 may be configured to access the memory device 1110 in response to a request from the host Host. For example, the memory controller 1120 may be configured to control read, write, erase, and background operations of the memory device 1110. The memory controller 1120 may be configured to provide an interface between the host Host and the memory device 1110. The memory controller 1120 may be configured to run firmware for controlling the memory device 1110.

The memory controller 1120 includes a Random Access Memory (RAM) 121, a processing unit 122, a host interface 123, memory interface 124, and an error correction block 125 operatively coupled via an internal bus. The RAM 121 may be used as at least one of an operation memory of the processing unit 122, a cache memory between the memory device 1110 and the host Host, and a buffer memory between the memory device 1110 and the host Host. The processing unit 122 may control the overall operation of the memory controller 1120. In addition, the memory controller 1120 may temporarily store program data provided from the host Host during a write operation.

The host interface 123 includes a protocol for performing data exchange between the host Host and the memory controller 1120. In an exemplary embodiment, the memory controller 1120 may be configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol a parallel-ATA protocol, a small computer small interface (SCSI) protocol, an enhanced small disk interface (ESDI) protocol, and an integrated drive electronics (IDE) protocol, a private protocol, and the like.

The memory interface 124 may interface with the memory device 1110. For example, the memory interface 124 may include a NAND interface or NOR interface.

The error correction block 125 may be configured to use an error correcting code (ECC) to detect and correct an error in data received from the memory device The processing unit 122 may adjust the read voltage according to an error detection result from the error correction block 125, and control the memory device 1110 to perform re-reading. In an exemplary embodiment, the error correction block 125 may be provided as an element of the memory controller 1120.

In another embodiment, the memory system 1100 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the memory device 1110 or the memory system 1100 may be embedded in various types of packages. For example, the memory device 1110 or the memory system 1100 may be packaged as Package on Package (PoP), Ball grid arrays (BGAs), Chip scale packages (CSPs), Plastic Leaded Chip Carrier (PLCC) Plastic Dual In Line Package (PDIP), Die in Waffle Pack Die in Wafer Form Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 16:
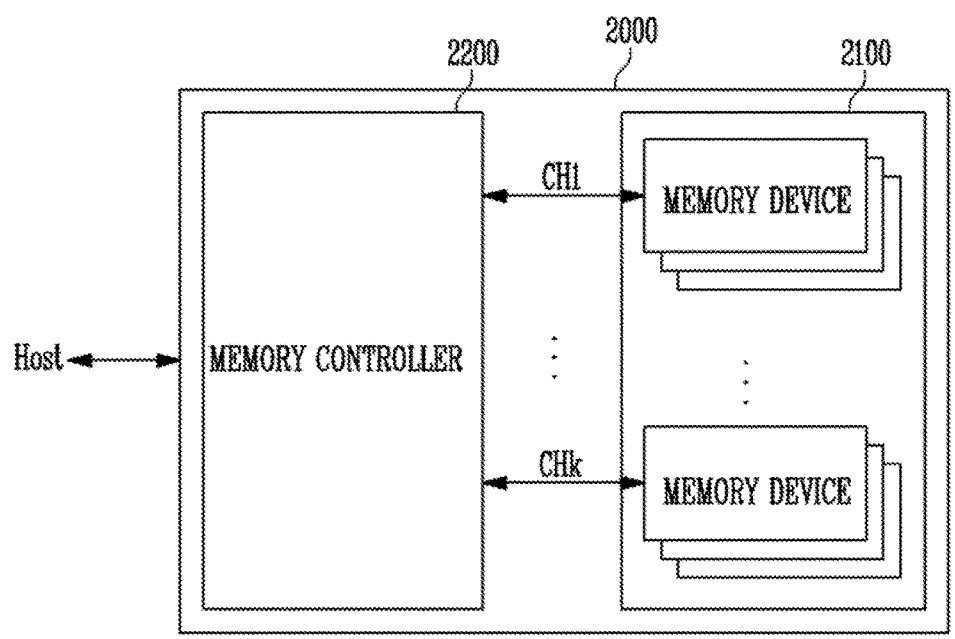
FIG. 16 is a block diagram illustrating another embodiment of a memory system including the memory device of FIG. 2.

FIG. 16 is a block diagram illustrating another embodiment of a memory system 2000 including the memory device 2100.

Referring to FIG. 16, the memory system 2000 includes the memory device 2100 and a memory controller 2200. The memory device 2100 may include a plurality of memory devices. The memory devices may be divided into a plurality of groups. Each of the plurality of groups may communicate with the memory controller 2200 through first to k-th channels CH1 to CHk. Each memory device ay have the same configuration and operation as the memory device 1110 described with reference to FIG. 2.

Each group may be configured to communicate with the memory controller 2200 through one common channel. The memory controller 2200 may have the same configuration as the memory controller 1120 described with reference to FIG. 15 and may be configured to control the plurality of memory devices of the memory device 2100 through the plurality of channels CH1 to CHk.

Figure 17:
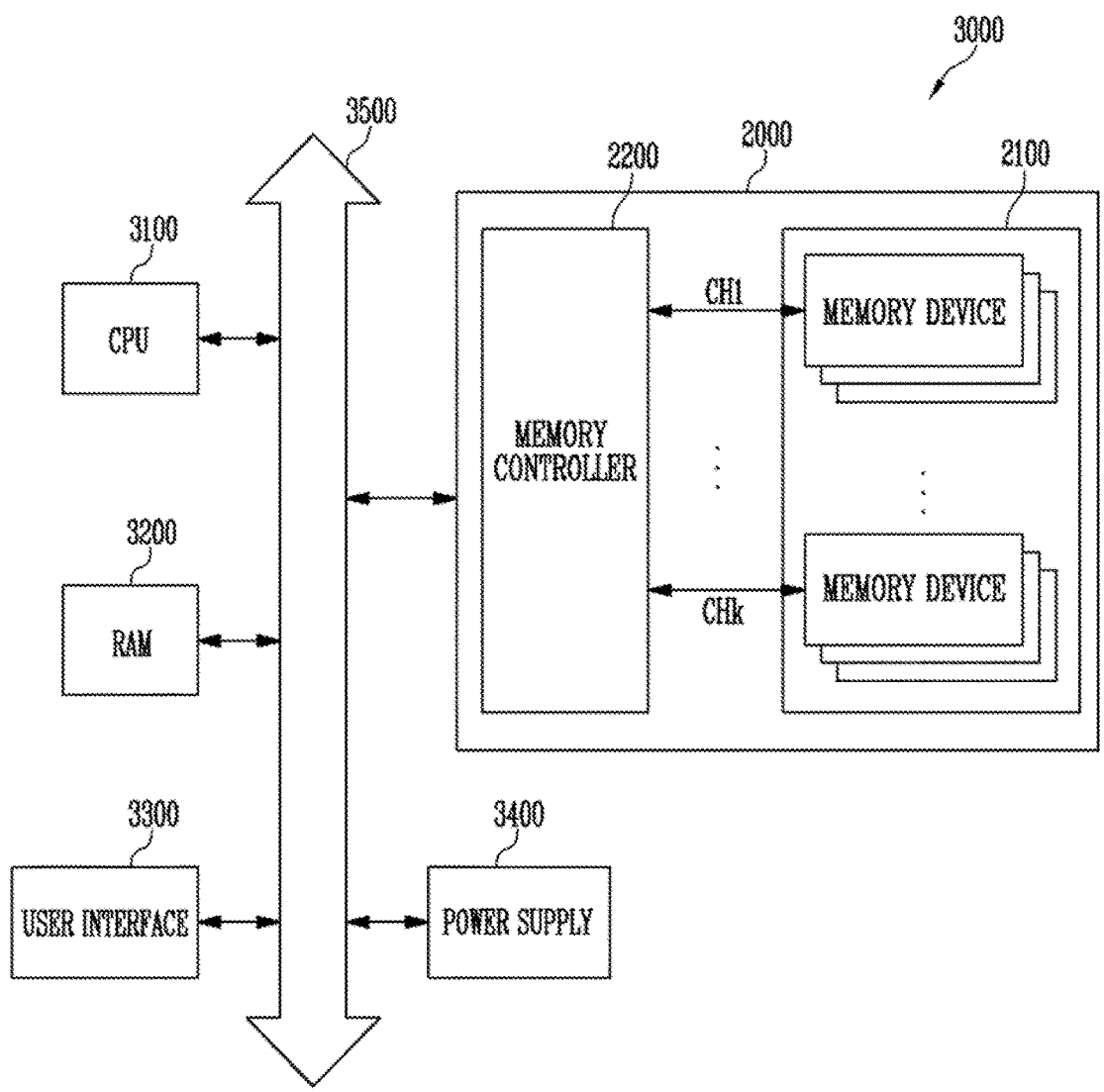
FIG. 17 is a block diagram illustrating a computing system including the memory system of FIG. 1.

FIG. 17 is a block diagram illustrating a computing system 3000 including the memory system 2000 of FIG. 16.

Referring to FIG. 17, the computing system 3000 may include a central processing unit (CPU) 3100, a random access memory (RAM) 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 17, the memory device 2100 is illustrated as being coupled to the system bus 3500 through the memory controller 2200. However, the memory device 2100 may be directly coupled to the system bus 3500. In this regard, the function of the memory controller 2200 may be performed by the CPU 3100 and the RAM 3200.

In FIG. 17, the memory system 2000 described with reference to FIG. 16 is illustrated as being provided. However, the memory system 2000 may be replaced with the memory system 1100 described with reference to FIG. 15. In an exemplary embodiment, the computing system 3000 may include both the memory systems 1100 and 2000 described with reference to FIGS. 15 and 16.

The present disclosure may improve the overall performance of a 3D memory device. More particularly, the present disclosure provides a 3d memory device exhibiting improved reliability, especially the reliability of a read operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A memory device, comprising:
 a memory block including a plurality of sub-memory blocks;
 a peripheral circuit configured to perform at least one of program, read and erase operations on the memory block or on a sub-memory block selected from among the sub-memory blocks; and
 a control logic configured to:
 control the peripheral circuit in a read operation on the memory block to set at least one bit line voltage for precharging to be used for the read operation,
 to determine whether a sub-memory block on which a partial erase operation has been performed is present among the sub-memory blocks, wherein all memory cells in the sub-memory block on which the partial erase operation has been performed are erased,
 wherein depending upon the determination the control logic changes the at least one bit line voltage for precharging depending on a position of a target sub-memory block for the read operation, and
 wherein the control logic controls the peripheral circuit so that, as a sequential position of the partially erased sub-memory block, in a program operation sequence leads those of other sub-memory blocks, the at least one bit line voltage for precharging to be used for the read operation is decreased.

2. The memory device according to claim 1, wherein the control logic controls the peripheral circuit so that the target sub-memory block is other than the partially erased sub-memory block.

3. The memory device according to claim 1, wherein the control logic controls the peripheral circuit so that, as the target sub-memory block is located at a relatively higher sequential position, the at least one bit line voltage for precharging is lower.

4. The memory device according to claim 1, wherein the peripheral circuit comprises:
 a voltage generation circuit configured to generate operating voltages required for various operations;
 a row decoder configured to transfer the operating voltages to the memory block; and a page buffer unit configured to apply bit line voltages to bit lines coupled to the memory block or to sense data in memory cells included in the memory block.

5. The memory device according to claim 4, wherein the page buffer unit is configured to adjust turn-on voltages for switches that transfer the bit line voltages to the bit lines.

6. The memory device according to claim 5, wherein the turn-on voltages are voltages applied to gates of the switches.

7. The memory device according to claim 5, wherein the bit line voltages are proportional to the turn-on voltages.

8. The memory device according to claim 1, wherein each of the sub-memory blocks comprises a normal memory block and a flag block.

9. The memory device according to claim 8, wherein:
the normal memory block stores user data, and
the flag block stores data related to the memory device.

10. The memory device according to claim 9, wherein the flag block stores data related to whether the partial erase operation has been performed on the memory block and data related to the partially erased sub-memory block.

11. A method for operating a memory device, comprising:
setting a bit line voltage;
determining whether a partially erased sub-memory block is present among sub-memory blocks included in a selected memory block;
maintaining the bit line voltage if a partially erased sub-memory block is not present;
maintaining the bit line voltage or setting a bit line voltage having a level lower than that of the bit line voltage depending on a position of a target sub-memory block for a read operation if the partially erased sub-memory block is present; and
performing the read operation using one of the maintained bit line voltage and the set bit line voltage,
wherein the bit line voltage is decreased as the target sub-memory block is located at a relatively higher sequential position.

12. The method according to claim 11, wherein the determining whether the partially erased sub-memory block is present in the selected memory block comprises determining whether the partially erased sub-memory block is present in the selected memory block based on data stored in a flag block included in the selected memory block.

13. The method according to claim 11, further comprising, if the partially erased sub-memory block is not present, performing the read operation using the bit line voltage that is set before determining whether the partially erased sub-memory block is present.

14. The method according to claim 11, wherein the bit line voltage is applied to bit lines coupled to the memory block to precharge the bit lines during a read operation of the memory block.

15. The method according to claim 11, further comprising setting the bit line voltage depending on a number of sub-memory blocks on which a partial erase operation has been performed when the bit line voltage is set.

16. A method for performing a read operation on at least one sub-memory block selected from among sub-memory blocks in a memory device, the method comprising:
applying a first bit line voltage;
maintaining the first bit line voltage or re-applying a second bit line voltage that becomes lower than the first bit line voltage, depending on a number of at least one partially erased sub-memory block and a position of a target sub-memory block for a read operation if the partially erased sub-memory block is present among the sub-memory blocks; and
performing the read operation on the selected sub-memory block using the first bit line voltage or the second bit line voltage,
wherein the second bit line voltage is decreased as the number of the partially erased sub-memory block is larger and the target sub-memory block is located at a relatively higher sequential position.

\* \* \* \* \*